United States Patent

Okumura et al.

[11] Patent Number: 6,108,384
[45] Date of Patent: Aug. 22, 2000

[54] DATA TRANSMITTION METHOD, DATA TRANSMITTING SYSTEM AND TRANSMITTER AND RECEIVER

[75] Inventors: Yukihiko Okumura; Fumiyuki Adachi, both of Yokohama, Japan

[73] Assignee: NTT Mobile Communications Network Inc., Japan

[21] Appl. No.: 09/011,820

[22] PCT Filed: Jun. 23, 1997

[86] PCT No.: PCT/JP97/02145

§ 371 Date: Feb. 23, 1998

§ 102(e) Date: Feb. 23, 1998

[87] PCT Pub. No.: WO97/50219

PCT Pub. Date: Dec. 31, 1997

[30] Foreign Application Priority Data

Jun. 24, 1996 [JP] Japan ................................. 8-163125

[51] Int. Cl.[7] .......................... H04L 23/02; H03D 1/00; G06F 11/00
[52] U.S. Cl. ......................... 375/262; 375/341; 714/794
[58] Field of Search ................................. 375/262, 341; 714/794, 795, 796, 792, 764, 798; 370/320, 335, 342, 441

[56] References Cited

U.S. PATENT DOCUMENTS

| | | | |
|---|---|---|---|
| 5,430,743 | 7/1995 | Marturano et al. | 714/708 |
| 5,790,596 | 8/1998 | Sexton | 375/228 |
| 5,896,374 | 4/1999 | Okumura et al. | 370/311 |
| 5,896,405 | 4/1999 | Moon | 714/795 |

*Primary Examiner*—Chi H. Pham
*Assistant Examiner*—Khai Tran
*Attorney, Agent, or Firm*—Brown Raysman Millstein Felder & Steiner LLP

[57] ABSTRACT

A data transmission method, data transmission system, and a transmitter and receiver are provided which can implement higher quality variable rate transmission by making a more positive rate decision. In a variable rate transmission method transmitting fixed time length frames, each including variable length transmitted data, a transmitting side transmits user data plus an error detecting code, and a receiving side, assuming the entire transmittable final bit positions of the frame data, carries out Viterbi decoding of the frame data to the final bit positions. If, at an assumed final bit position, the difference between the maximum value of likelihoods of a plurality of decoded data sequence candidates and the likelihood of the decoded data sequence obtained by terminating the decoding process is within a predetermined range, and a calculated error detecting code agrees with a received error detecting code, a decision is made that the assumed final bit position is the final bit position of the transmitted frame data, and the transmitted data is recovered.

14 Claims, 17 Drawing Sheets

CONFIGURATION OF RECEIVER

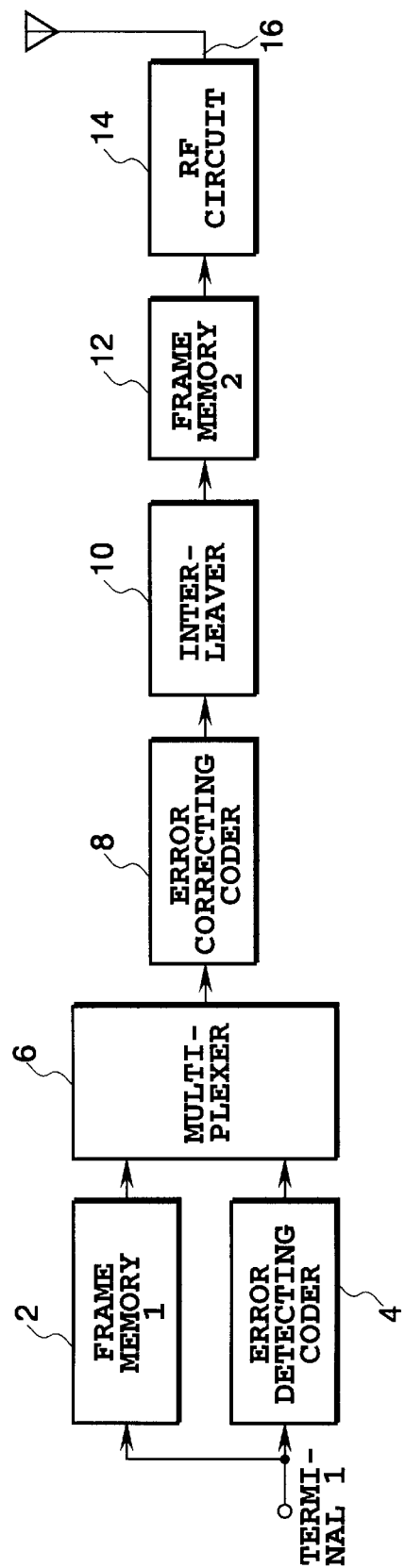

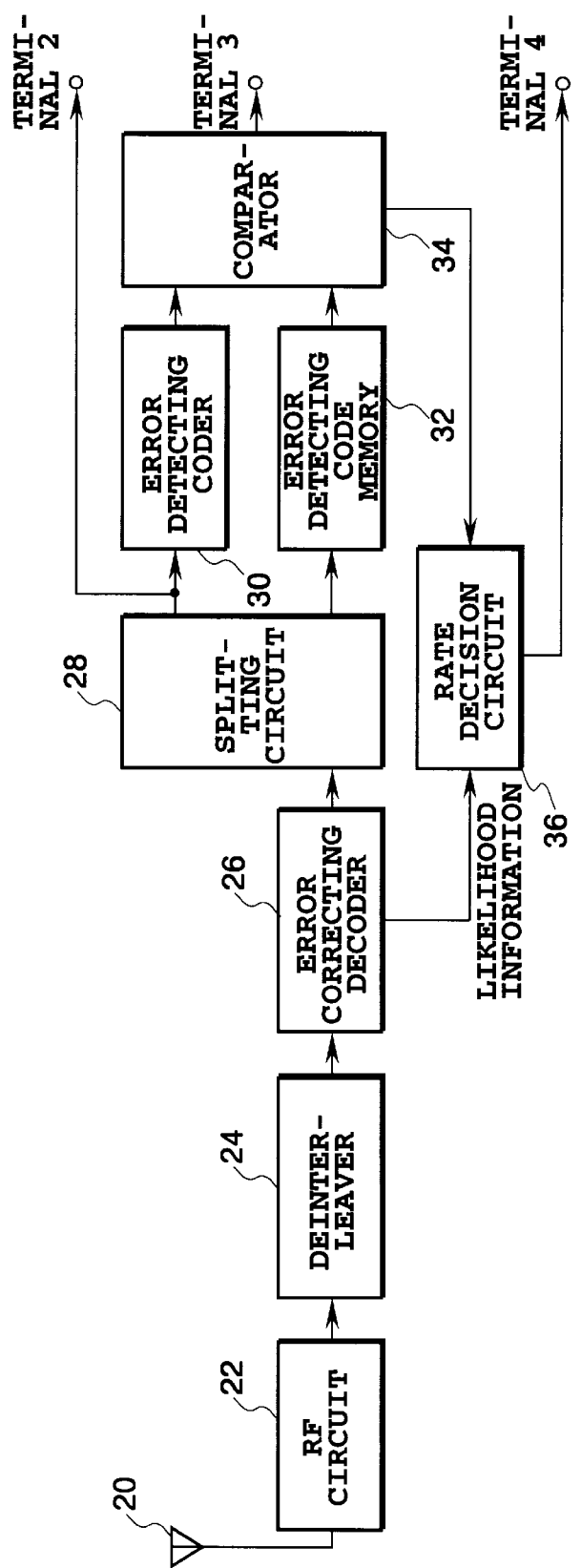
FIG.1B CONFIGURATION OF RECEIVER

OUT OF MULTIPLEXER

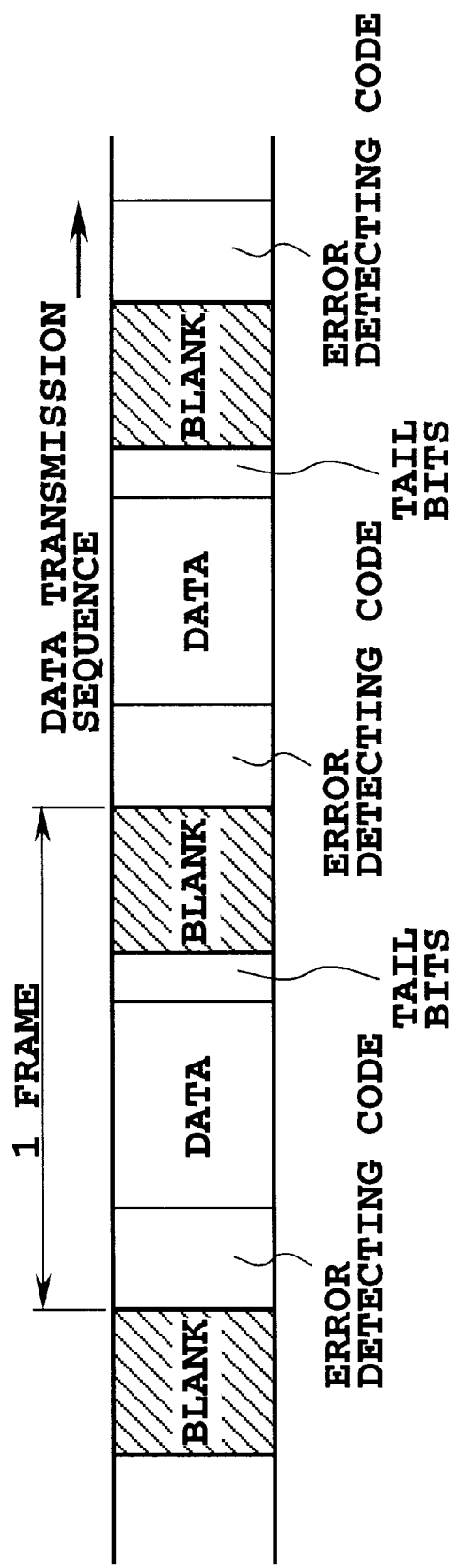
FIG.2B OUT OF MULTIPLEXER

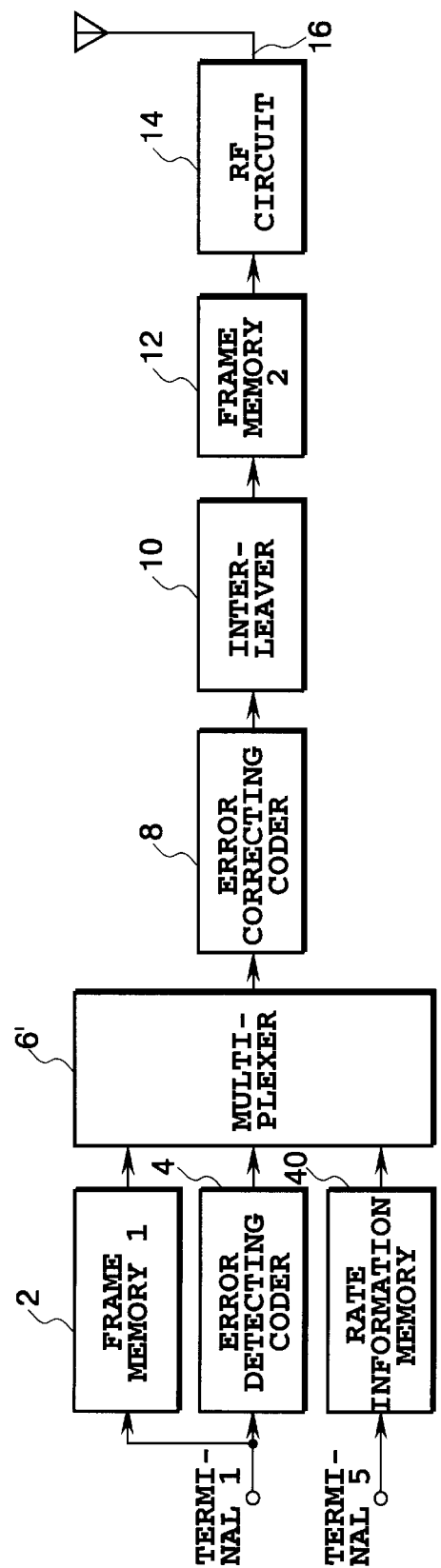
FIG.7A CONFIGURATION OF TRANSMITTER

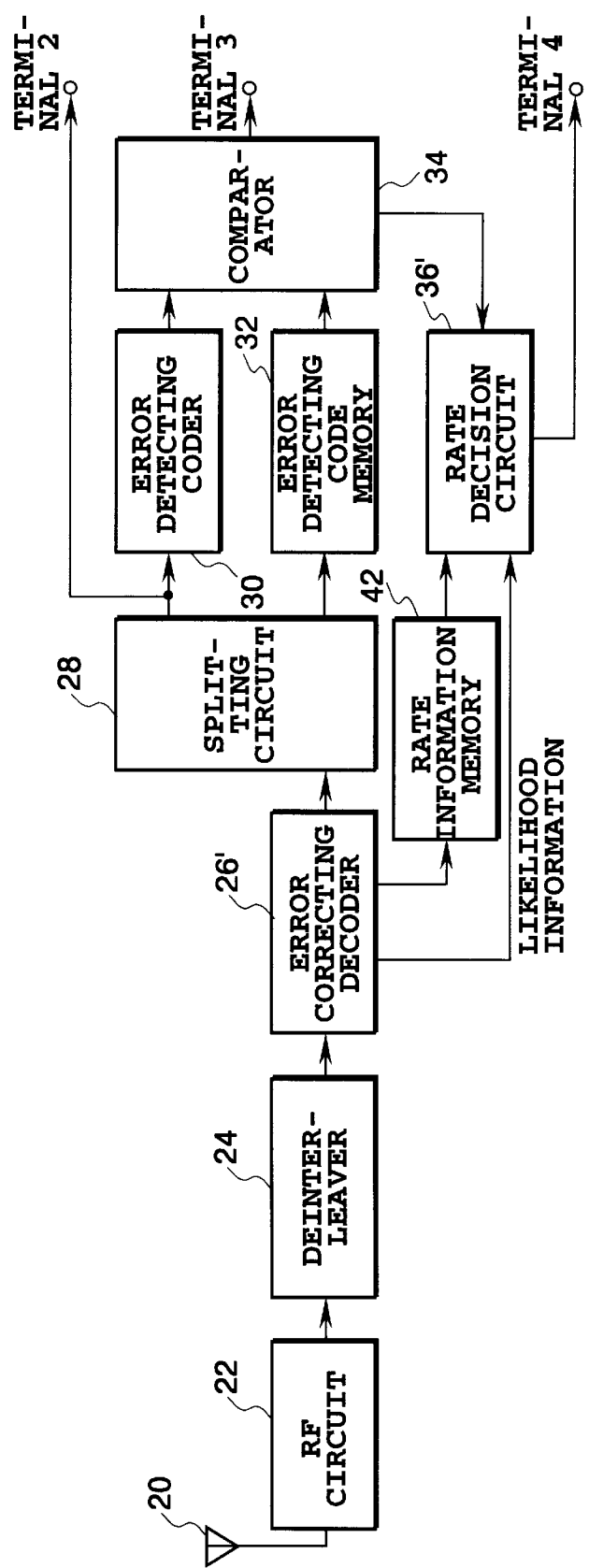
CONFIGURATION OF RECEIVER *FIG.7B*

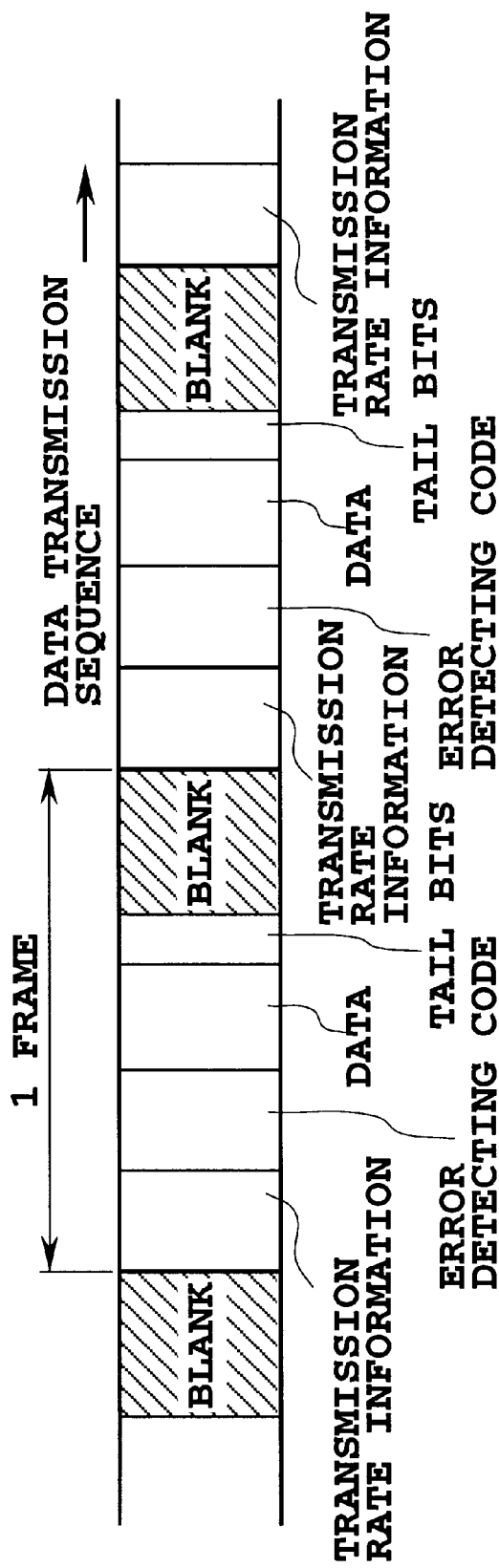

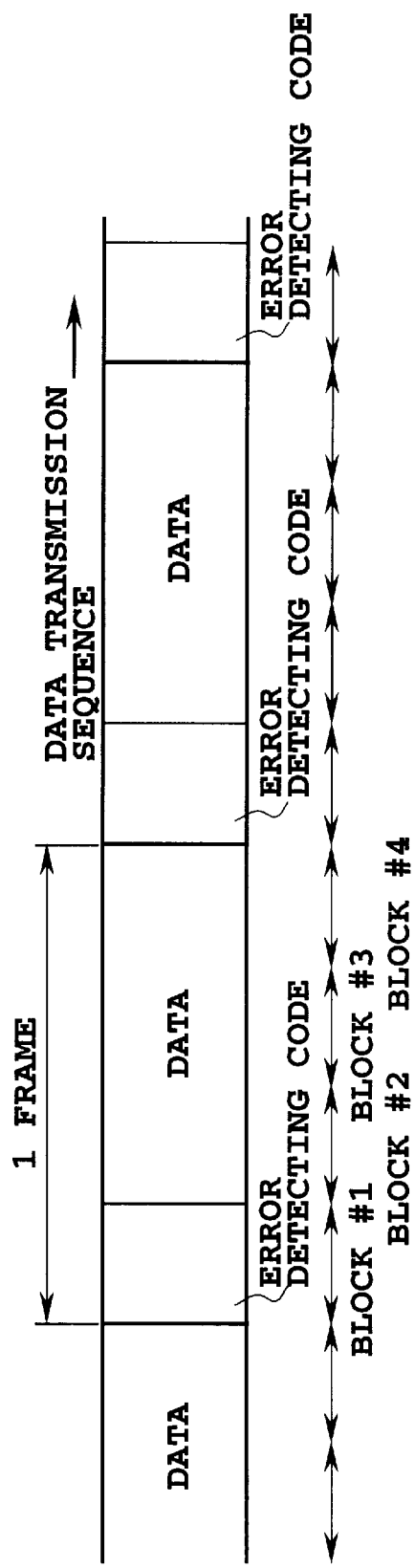

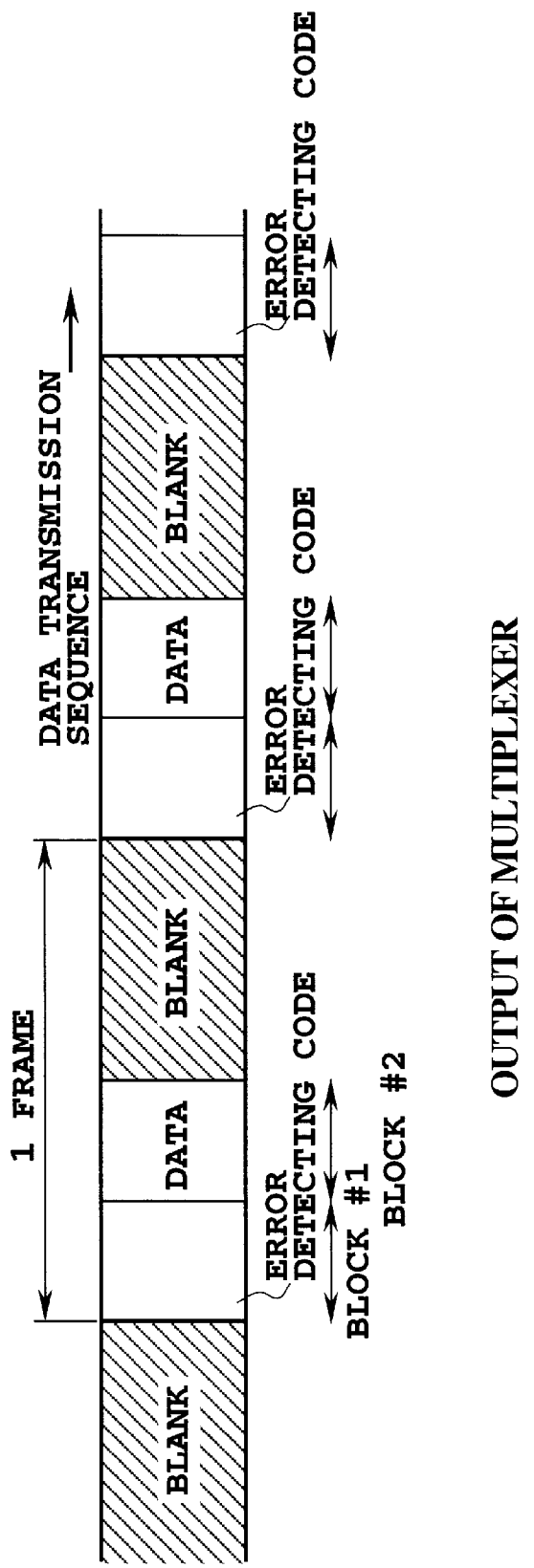
FIG.10B OUTPUT OF MULTIPLEXER

DATA TRANSMITTION METHOD, DATA TRANSMITTING SYSTEM AND TRANSMITTER AND RECEIVER

TECHNICAL FIELD

The present invention relates to a data transmission method, data transmission system, and a transmitter and receiver, which implement an apparent variable rate transmission by transmitting variable length data in fixed length frames at a constant transmission rate.

BACKGROUND ART

In a data transmission method which converts information such as a voice signal into digital data, and transmits the data after conversion, an amount of information to be transmitted is not temporally fixed, but varies from time to time in general.

Accordingly, the transmission rate can be varied by dividing the transmission data into fixed length frames, and by transmitting variable bit length data in individual frames. This makes it possible for a transmitter to effectively transmit the information at a constant frame period, and to avoid needless transmission, thereby saving consumed power.

To achieve the data transmission at a variable rate, it is necessary for a receiver to acquire information about the transmission rate of each frame by some means. Conventionally, there are proposed two methods to achieve this: A first method transmits rate information of each frame as part of the frame data so that the receiver can decide the rate based on that rate information; and a second method does not transmit the rate information, but utilizes error detection codes added to the transmission data for representing the communication quality, in which case the receiver decides the rate based on the error detection codes.

On the other hand, in communications environments such as data transmission through radio channels, in which a lot of errors will occur, error correction (FEC: Forward Error Correction) of the transmission data is widely carried out to improve the quality of the transmission. As the error correcting code and error correcting decoding, a convolutional code and maximum likelihood decoding such as Viterbi decoding are known.

In the second method which does not transmit the rate information to the receiver, but has the receiver decide the rate from the error detecting code added to the transmission data to represent the communication quality, the error rate in the rate decision depends on the word length of the error detecting code, and even if the transmission error can be reduced, the decision error rate, that is, the probability of making a decision at a wrong rate that no transmission error has occurred, cannot be reduced below a certain level.

On the other hand, in the first method, in which the rate information is transmitted from the transmitter to the receiver, the receiver cannot decide the effective length of the received frames if an error has occurred during the transmission. It is difficult for the receiver to recover the transmitted data correctly even if the data portion itself is free from the error.

Therefore, an object of the present invention is to solve the foregoing problems, and to provide a data transmission method, data transmission system, and a transmitter and receiver, which can implement high quality variable rate data transmission by making a reliable rate decision in any communications environment.

DISCLOSURE OF THE INVENTION

To implement the foregoing object, the present invention implements data transmission by the following steps and provides a data transmission system comprising the following means.

A transmitting side divides the transmitted data into fixed time length frames, each containing variable bit data, and adds to a fixed position of each frame the error detecting code calculated for the transmitted data in the frame. Subsequently, the transmitting side generates for error correction the error correcting code for the transmitted data and the error detecting code, carries out interleaving which is common to individual frames, and transmits the data at a fixed transmission rate. In this case, a blank in a frame left after the error correcting coding is not transmitted.

On the other hand, the receiving side carries out, for each received frame data, on a frame by frame basis, the deinterleaving which is common to respective frames, followed by error correcting coding of the frame data and calculation of the error detecting code of the transmitted data with sequentially assuming entire transmittable final bit positions of each frame data. The receiving side makes a decision that an assumed final bit position is the final bit position of the transmitted frame data, when, at each final bit position, a difference between a maximum value of likelihoods of a plurality of decoded data sequence candidates with respect to the transmitted data sequence and a likelihood of a decoded data sequence obtained by terminating decoding with respect to the transmitted data sequence is in a predetermined range, and the calculated error detecting code agrees with a received error detecting code, and recovers the transmitted data. If a plurality of final bit positions are detected at which the likelihood differences during the error correcting decoding are in the predetermined range, and the comparing results of the error detecting codes agree with each other, the receiving side can make a decision that the final bit position that gives the minimum likelihood difference is the final bit position of the transmitted frame data.

Alternatively, the transmitting side can transmit by adding to a fixed position in each frame information bits representing the bit number or transmission rate of the transmitted data in the frame, and the receiving side can carries out the deinterleaving, and assuming the final bit position on the basis of the received transmission rate information, can perform the error correcting decoding of the frame data using the maximum likelihood decoding and the calculation of the error detecting code of the transmitted data. The receiving side makes a decision that the assumed final bit position is the actual final bit position if the calculated error detecting code agrees with the received error detecting code. If they disagree, assuming the entire transmittable final bit positions of the frame data other than the final bit position indicated by the rate information, the receiving side sequentially performs the error correcting decoding of the deinterleaved received frame data and the calculation of the error detecting code thereof to the final positions, so that a decision can be made of the final bit position of the transmitted frame data on the basis of the likelihood differences during the error correcting decoding and the comparing result of the error detecting codes.

With regard to the information bits representing the transmission rate, the transmitter can adds the rate information associated with the present frame to a fixed position in the immediately previous frame to be transmitted, and the receiver can assume the final bit position of the present frame data from the rate information received in the immediately previous frame. In the case where the rate information is transmitted in the immediately previous frame, the bits in the same frame, that is, the transmitted data and the error detecting code in the present frame and the rate information of the next frame undergo the error correcting coding and decoding in the same procedure as described above.

As described above, the present invention, which utilizes in addition to the error detecting code the likelihood information obtained during the error correcting decoding as the information in the rate decision, implements a high quality variable rate data transmission which can greatly improve the rate decision error rate as compared with the rate decision of the conventional variable rate data transmission which does not transmit the rate information.

Furthermore, the present invention can implement, in the variable rate data transmission method of the rate information transmission type, the variable rate data transmission that improves the frame error rate and the rate decision error rate by making the rate decision using the likelihood information when any error has error occurred in the rate information during the transmission.

According to the first aspect of the present invention, a data transmission method which varies an average transmission rate by transmitting frames, each of which has a fixed time length, and contains variable length transmitted data, said data transmission method comprises, at a transmitting side, the steps of:
calculating an error detecting code of the transmitted data of each frame; and
transmitting frame data at a constant transmission rate, said frame data including the error detecting code, transmitted data and tail bits, and having undergone error correcting coding using a convolutional code and interleaving common to respective frames, and at a receiving side, the steps of:
successively assuming frame by frame entire transmittable final bit positions of the frame data after having performed, on received frame data, deinterleaving common to respective frames, and carrying out to the assumed final bit positions error correcting decoding based on maximum likelihood decoding and calculation of an error detecting code of a transmitted data portion;
deciding, at each final bit portion during error correcting decoding, that the final bit position is the final bit position of the transmitted frame data if a difference between a maximum value of likelihoods of a plurality of decoded data sequence candidates with respect to the transmitted data sequence and a likelihood of a decoded data sequence obtained by terminating decoding with respect to the transmitted data sequence is in a predetermined range, and the calculated error detecting code agrees with a received error detecting code; and
recovering the variable length transmitted data based on a result obtained by the step of deciding.

According to the second aspect of the present invention, a data transmission method which varies an average transmission rate by transmitting frames, each of which has a fixed time length, and contains variable length transmitted data, said data transmission method comprises, at a transmitting side, the steps of:
calculating, frame by frame, transmission rate information representing a transmission rate of the transmitted data, and an error detecting code of the transmitted data; and
transmitting frame data at a constant transmission rate, said frame data including the transmission rate information, the error detecting code, transmitted data and tail bits, and having undergone error correcting coding using a convolutional code and interleaving common to respective frames, and at a receiving side, the steps of:
assuming frame by frame a final bit position based on received transmission rate information after having performed, on received frame data, deinterleaving common to respective frames, and carrying out to the assumed final bit position error correcting decoding based on maximum likelihood decoding and calculation of an error detecting code of a transmitted data portion;
deciding that the assumed final bit position is a final bit position of the transmitted frame data if the calculated error detecting code agrees with a received error detecting code bit by bit;
successively assuming with respect to the received frame data after the deinterleaving, if the error decoding codes disagree at the steps of deciding, entire transmittable final bit positions of the frame data other than the final bit position assumed based on the received transmission rate information, and carrying out to the assumed final bit positions error correcting decoding based on maximum likelihood decoding and calculation of an error detecting code of a transmitted data portion;
deciding, at each final bit position during error correcting decoding, that the final bit position is the final bit position of the transmitted frame data if a difference between a maximum value of likelihoods of decoded data sequence candidates with respect to the transmitted data sequence and a likelihood of a decoded data sequence obtained by terminating decoding with respect to the transmitted data sequence is in a predetermined range, and the calculated error detecting code agrees with a received error detecting code; and
recovering variable length transmitted data based on a result obtained by the step of deciding.

Here, the data transmission method may further comprise the step of deciding that a final bit position that makes the difference of the likelihoods minimum is the final bit position of the transmitted frame data, in the case where a plurality of final bit positions are detected which satisfy, at each final bit position during error correcting decoding, conditions that the difference between the maximum value of the likelihoods of the decoded data sequence candidates with respect to the transmitted data sequence and the likelihood of the decoded data sequence obtained by terminating decoding with respect to the transmitted data sequence is in the predetermined range, and the calculated error detecting code agrees with the received error detecting code.

According to the third aspect of the present invention, a data transmission system which varies an average transmission rate by transmitting frames, each of which has a fixed time length, and contains variable length transmitted data, said data transmission system comprises:

in a transmitter,
means for calculating an error detecting code of the transmitted data of each frame; and
means for transmitting frame data at a constant transmission rate, said frame data including the error detecting code, transmitted data and tail bits, and having undergone error correcting coding using a convolutional code and interleaving common to respective frames, and in a receiver,
means for successively assuming frame by frame entire transmittable final bit positions of the frame data after having performed, on received frame data, deinterleaving common to respective frames, and carrying out to the assumed final bit positions error correcting decoding based on maximum likelihood decoding and calculation of an error detecting code of a transmitted data portion, means for deciding, at each final bit position during error correcting decoding, that the final bit position is the final bit position of the transmitted frame data if a difference between a maximum value of likelihoods of a plurality of decoded data sequence candidates with respect to the transmitted data sequence and a likelihood of a decoded data sequence obtained by terminating decoding with respect to the transmitted data sequence is in a predetermined range, and the calculated error detecting code agrees with a received error detecting code; and means for recovering the variable length transmitted data based on a result obtained by the step of deciding.

According to the fourth aspect of the present invention, a data transmission system which varies an average transmission rate by transmitting frames, each of which has a fixed time length, and contains variable length transmitted data, said data transmission system comprises:

in a transmitter, means calculating, frame by frame, transmission rate information representing a transmission rate of the transmitted data, and an error detecting code of the transmitted data; and means for transmitting frame data at a constant transmission rate, said frame data including the transmission rate information, the error detecting code, transmitted data and tail bits, and having undergone error correcting coding using a convolutional code and interleaving common to respective frames, and in a receiver, means for assuming frame by frame a final bit position based on received transmission rate information after having performed, on received frame data, deinterleaving common to respective frames, and carrying out to the assumed final bit position error correcting decoding based on maximum likelihood decoding and calculation of an error detecting code of a transmitted data portion;

means for deciding that the assumed final bit position is a final bit position of the transmitted frame data if the calculated error detecting code agrees with a received error detecting code bit by bit;

means for successively assuming with respect to the received frame data after the deinterleaving, if the error detecting codes disagree at the step of deciding, entire transmittable final bit positions of the frame data other than the final bit position assumed based on the received transmission rate information, and carrying out to the assumed final bit positions error correcting decoding based on maximum likelihood decoding and calculation of an error detecting code of a transmitted data portion;

means for deciding, at each final bit position during error correcting decoding, that the final bit positions the final bit position of the transmitted frame data if a difference between a maximum value of likelihoods of decoded data sequence candidates with respect to the transmitted data sequence and a likelihood of a decoded data sequence obtained by terminating decoding with respect to the transmitted data sequence is in a predetermined range, and the calculated error detecting code agrees with a received error detecting code; and recovering variable length transmitted data based on a result obtained by the step of deciding.

Here, the data transmission system may further comprise means for deciding that a final bit position that makes the difference of the likelihoods minimum is the final bit position of the transmitted frame data, in the case where a plurality of final bit positions are detected which satisfy, at each final bit position during error correcting decoding, conditions that the difference between the maximum value of the likelihoods of the decoded data sequence candidates with respect to the transmitted data sequence and the likelihood of the decoded data sequence obtained by terminating decoding with respect to the transmitted data sequence is in the predetermined range, and the calculated error detecting code agrees with the received error detecting code.

According to the fifth aspect of the present invention, a data transmission method which varies an average transmission rate by transmitting frames, each of which has a fixed time length, and contains variable length transmitted data, said data transmission method comprises, at a transmitting side, the steps of:

calculating an error detecting code of the transmitted data of each frame; and transmitting frame data at a constant transmission rate, said frame data, which includes the error detecting code and transmitted data, having been divided into blocks, each of which has undergone error correcting coding using a block code, and said frame data having undergone interleaving common to respective frames, and at a receiving side, the steps of:

successively assuming frame by frame entire transmittable final bit positions of the frame data after having performed, on received frame data, deinterleaving common to respective frames, and carrying out to the assumed final bit positions error correcting decoding based on block decoding of respective blocks beginning from a first block, and calculation of an error detecting code of a transmitted data portion;

deciding that the final bit position is the final bit position of the transmitted frame data if likelihoods obtained during error correcting decoding of individual blocks are in a predetermined range, and the calculated error detecting code agrees with a received error detecting code; and recovering the variable length transmitted data based on a result obtained by the step of deciding.

According to the sixth aspect of the present invention, a data transmission method which varies an average transmission rate by transmitting frames, each of which has a fixed time length, and contains variable length transmitted data, said data transmission method comprises, at a transmitting side, the steps of:

calculating, frame by frame, transmission rate information representing a transmission rate of the transmitted data, and an error detecting code of transmitted data; and transmitting frame data at a constant transmission rate, said frame data including the transmission rate information, the error detecting code, and transmitted data, and having undergone error correcting coding using a block code and interleaving common at receiving frames, and at a receiving side, the steps of:

assuming frame by frame a final bit position based on received transmission rate information after having performed, on received frame data, deinterleaving common to respective frames, and carrying out to the assumed final bit position error correcting decoding based on block decoding on a block by block basis beginning from a first block of the frame data, and calculation of an error detecting code of a transmitted data portion;

deciding that the assumed final bit position is a final bit position of the transmitted frame data if the calculated error detecting code agrees with a received error detecting code bit by bit;

successively assuming with respect to the received frame data after the deinterleaving, if the error detecting codes disagree at the step of deciding, entire transmittable final bit positions of the frame data other than the final bit position assumed based on the received transmission rate information, and carrying out to the assumed final bit positions error correcting decoding based on block decoding and calculation of an error detecting code of a transmitted data portion;

deciding, at each final bit position during error correcting decoding, that the final bit position is the final bit position of the transmitted frame data if likelihoods obtained in error correcting decoding of respective blocks are in a predetermined range, and the calculated error detecting code agrees with a received error detecting code; and recovering variable length transmitted data based on a result obtained by the step of deciding.

Here, the data transmission method may further comprise the step of deciding that a final bit position that makes the difference of the likelihoods minimum is the final bit position of the transmitted frame data, in the case where a plurality of final bit positions are detected which satisfy, at each final bit position during error correcting decoding, conditions that the likelihoods obtained during the error correcting decoding of the respective blocks are in the predetermined range, and the calculated error detecting code agrees with the received error detecting code.

According to the seventh aspect of the present invention, a data transmission system which varies an average transmission rate by transmitting frames, each of which has a fixed time length, and contains variable length transmitted data, said data transmission system comprises:

in a transmitter,
means for calculating an error detecting code of the transmitted data of each frame; and
means for transmitting frame data at a constant transmission rate, said frame data, which includes the error detecting code and transmitted data, having been divided into blocks, each of which has undergone error correcting coding using a block code, and said frame data having undergone interleaving common to respective frames, and in a receiver,
means for successively assuming frame by frame entire transmittable final bit positions of the frame data after having performed, on received frame data, deinterleaving common to respective frames, and for carrying out to the assumed final bit positions error correcting decoding based on block decoding of respective blocks beginning from first block, and calculation of an error detecting code of a transmitted data portion,
means for deciding that the final bit position is the final bit position of the transmitted frame data if likelihoods obtained during error correcting decoding of individual blocks are in a predetermined range, and the calculated error detecting code agrees with a received error detecting code; and
means for recovering the variable length transmitted data based on a result obtained by the means for deciding.

According to the eighth aspect of the present invention, a data transmission system which varies an average transmission rate by transmitting frames, each of which has a fixed time length, and contains variable length transmitted data, said data transmission in system comprises:

in a transmitter,
means for calculating, frame by frame, transmission rate information representing a transmission rate of the transmitted data, and an error detecting code of the transmitted data; and
means for transmitting frame data at a constant transmission rate, said frame data including the transmission rate information, the error detecting code, and transmitted data, and having undergone error correcting coding using a block code and interleaving common to respective frames, and in a receiver,
means for assuming frame by frame a final bit position based on received transmission rate information after having performed, on received frame data, deinterleaving common to respective frames, and carrying out to the assumed final bit position error correcting decoding based on block decoding on a block by block basis beginning from a first block of the frame data, and calculation of an error detecting code of a transmitted data portion;
means for deciding that the assumed final bit position is a final bit position of the transmitted frame data if the calculated error detecting code agrees with a received error detecting code bit by bit;
means for successively assuming with respect to the received frame data after the deinterleaving, if the error detecting codes disagree in the means for deciding, entire transmittable final bit positions of the frame data other than the final bit position assumed based on the received transmission rate information, and carrying out to the assumed final bit positions error correcting decoding based on block detecting and calculation of an error detecting code of a transmitted data portion;
means for deciding, at each final bit position during error correcting decoding, that the final bit positions is the final bit position of the transmitted frame data if likelihoods obtained in error correcting decoding of respective blocks are in a predetermined range, and the calculated error detecting code agrees with a received error detecting code; and
means for recovering variable length transmitted data based on a result obtained by the means for deciding.

Here, the data transmission system may further comprise means for deciding that a final bit position that makes the difference of the likelihoods minimum is the final bit position of the transmitted frame data, in the case where a plurality of final bit positions are detected which satisfy, at each final bit position during error correcting decoding, conditions that the likelihoods obtained during the error correcting decoding of the respective blocks are in the predetermined range, and the calculated error detecting code agrees with the received error detecting code.

According to the ninth aspect of the present invention, a transmitter for implementing the data transmission method is provided.

According to the tenth aspect of the present invention, a receiver for implementing the data transmission method is provided.

BRIEF DESCRIPTION OF THE DRAWINGS

FIG. 1A is a block diagram showing a configuration of a transmitter in an embodiment 1 in accordance with the present invention;

FIG. 1B is a block diagram showing a configuration of a receiver in the embodiment 1 in accordance with the present invention;

FIG. 2B is a diagram illustrating a frame structure when the transmission rate of the transmitted data is less than maximum in the embodiment 1 in accordance with the present invention.

FIG. 7A is a block diagram showing a configuration of a transmitter in an embodiment 2 in accordance with the present invention;

FIG. 7B is a block diagram showing a configuration of a receiver in the embodiment 2 in accordance with the present invention;

FIG. 8B is a diagram illustrating a frame structure of the transmitted data in the embodiment 2 in accordance with the present invention;

FIG. 10A is a diagram illustrating a frame structure of transmitted data in an embodiment 3 in accordance with the present invention;

FIG. 10B is a diagram illustrating a frame structure of the transmitted data in an embodiment 3 in accordance with the present invention;

BEST MODE FOR CARRYING OUT THE INVENTION

Figure 2A:
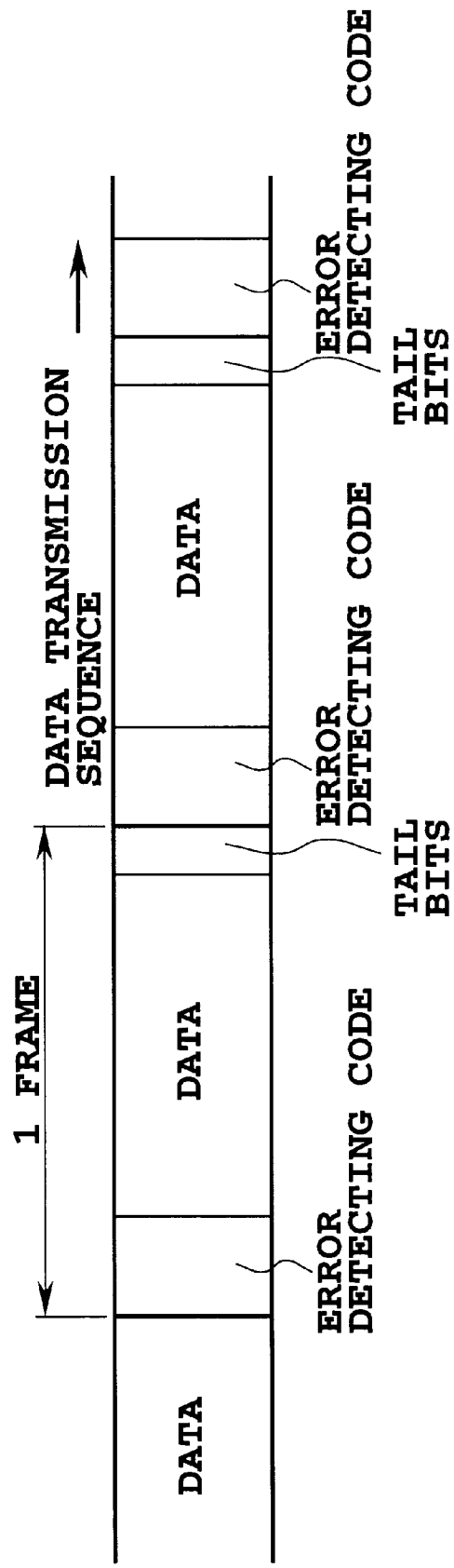
FIG. 2A is a diagram illustrating a frame structure when the transmission rate of transmitted data is maximum in the embodiment 1 in accordance with the present invention.

The invention will now be described with reference to the accompanying drawings.

Embodiment 1

FIGS. 1A and 1B are block diagrams showing configurations of a transmitter and a receiver of an embodiment 1 in accordance with the present invention.

In FIG. 1A, a transmitted data sequence applied to a terminal 1 is delivered to an error detecting coder 4 and a frame memory 1 (2). The frame memory 1 (2) holds a data set of a predetermined number of bits (that is, a frame). The error detecting coder 4 calculates an error detecting code (CRC code, for example) of each frame of the transmitted data.

Next, a multiplexer 6 adds, to the error detecting code calculated by the error detecting coder 4, the transmitted data read from the frame memory 1 (2) and tail bits necessary for error correcting decoding, and sequentially outputs frames.

FIGS. 2A and 2B show data sequences output from the multiplexer 6. FIG. 2A illustrates the case in which the transmission rate is maximum, whereas FIG. 2B illustrates a case in which the transmission rate is less than the maximum rate. Blanks (data-less intervals) arise in the frames in the transmission less than the maximum rate as illustrated in FIG. 2B. The data sequence output from the multiplexer 6 undergoes convolutional coding by an error correcting coder 8, followed by interleaving by an interleaver 10.

Figure 3:
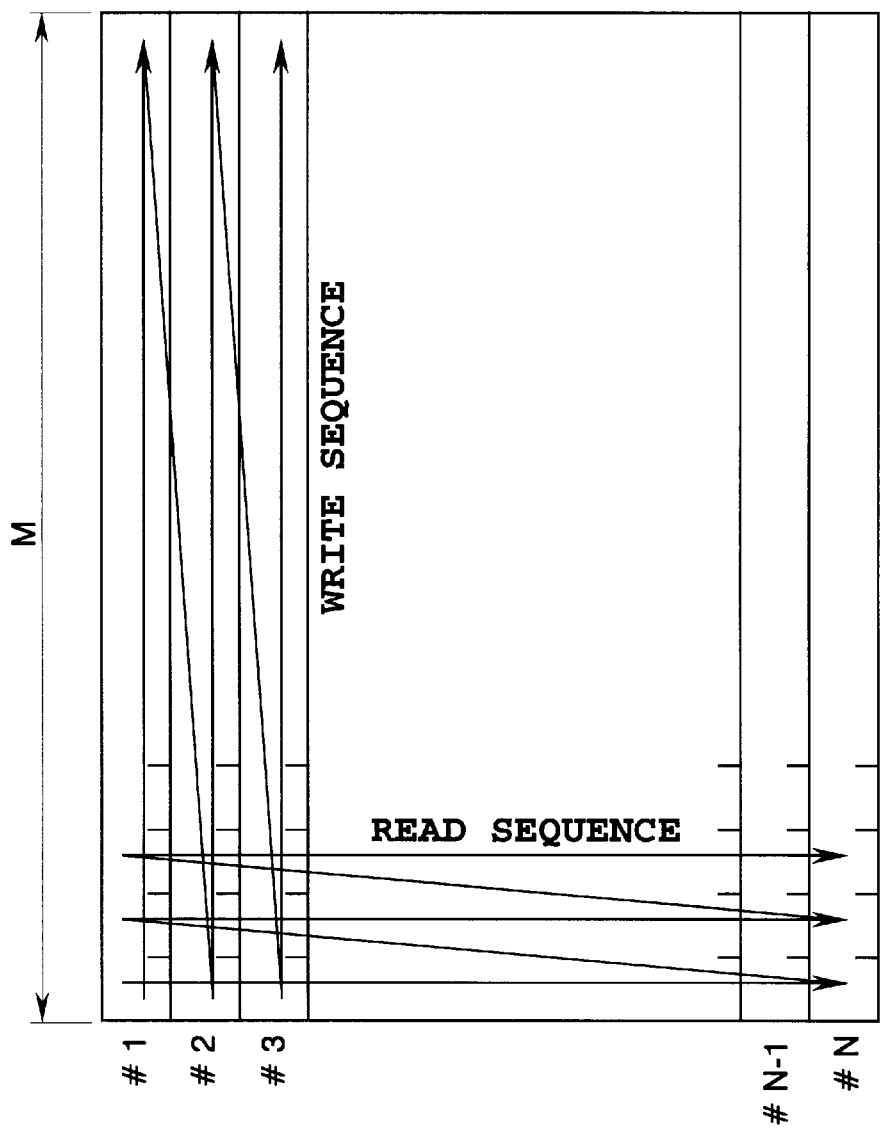
FIG. 3 is a diagram illustrating the processing of the interleaver in the embodiment 1 in accordance with the present invention.

FIG. 3 illustrates an example of the interleaving by the interleaver 10. The data sequence of one frame is output in a direction different from the input direction. That is, the transmitted data input row by row is output column by column. The data sequence output from the interleaver 10 is written in a frame memory 2 (12).

Figure 4:
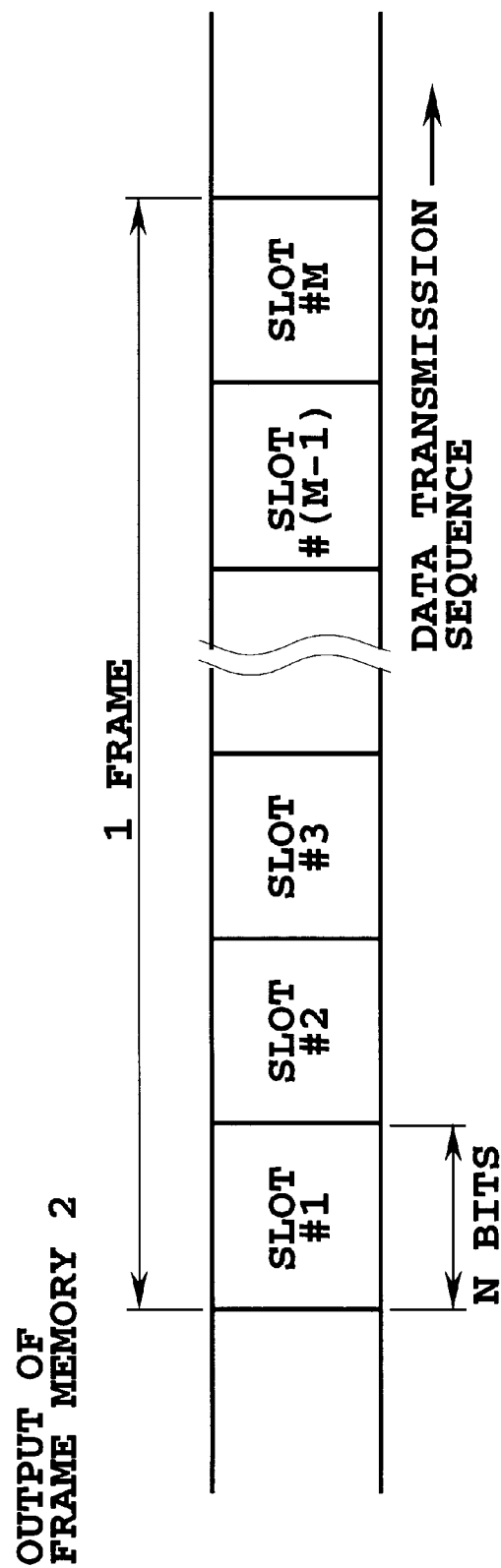
FIG. 4 is a diagram illustrating a frame structure of the transmitted data in the embodiment 1 in accordance with the present invention.

FIG. 4 illustrates a frame structure of the data sequence output from the frame memory 2 (12). The data section corresponding to the column in the interleaver 10 is referred to as "slot", with each slot consisting of N bits, and each frame consisting of M slots. Thus, each frame consists of N×M bits.

The output of the interleaver 10 is input to the frame memory 2 (12). In the foregoing processing, the transmitting side writes the input data sequence to the frame memory 1 (2) frame by frame, carries out error correcting coding and interleaving of each frame as a single process, and then generates input data to be supplied to a primary modulator from the frame memory 2 (12). As a result, the transmitted data sequence has a delay of one frame involved in the interleaving and other processings.

The output data sequence of the frame memory 2 (12) is modulated by an RF circuit 14, and is transmitted through an antenna 16. As a modulation scheme, a spread spectrum modulation, QPSK modulation, or the like is used. The modulation is not carried out onto the blanks in the slots including no data. Thus, the transmitter can achieve the data transmission at a variable bit length in a constant frame period.

Next, as illustrated in FIG. 1B, the receiver, receiving a received signal through an antenna 20, demodulates it by an RF circuit 22, and then sequentially inputs the demodulated signal to a deinterleaver 24. The deinterleaver 24, including a memory, carries out a procedure in an opposite way to that of the interleaver 10 in the transmitting side, that is, writes the data column by column (slot by slot) into the memory, and reads them row by row. This makes possible to recover the original data sequence of one frame, thereby generating the error detecting code and the transmitted data sequence. The interleaving and deinterleaving are provided for improving the error correcting effect by preventing burst errors.

The deinterleaved data sequence is fed to an error correcting decoder 26 that carries out its error correcting decoding using the maximum likelihood decoding. The data sequence undergone the error correcting decoding is split into the error detecting code and the data sequence by a splitting circuit 28. The error detecting code is input to an error detecting code memory 32 to be held.

On the other hand, the data sequence is output from a terminal 2 as received data, and input to an error detecting coder 30 at the same time. The error detecting coder 30 repeats the error detecting coding of the data sequence corresponding to that of the transmitter. The re-coded error detecting code is compared bit by bit with the received error detecting code by a comparator 34, and if the entire bits agree with each other, a matching signal is fed to at rate decision circuit 36.

The error correcting decoding and the calculation of the error detecting code are carried out with sequentially assuming transmittable final bit positions of the frame data. In this case, the error correcting decoder 26 supplies the rate decision circuit 36 with likelihood information with respect to the results obtained by decoding to the final bit positions. The rate decision circuit 36 decides the final bit position, that is, the transmission rate of each frame on the basis of the likelihood information and the matching signal of the error detecting code fed from the comparator 34.

Figure 5:
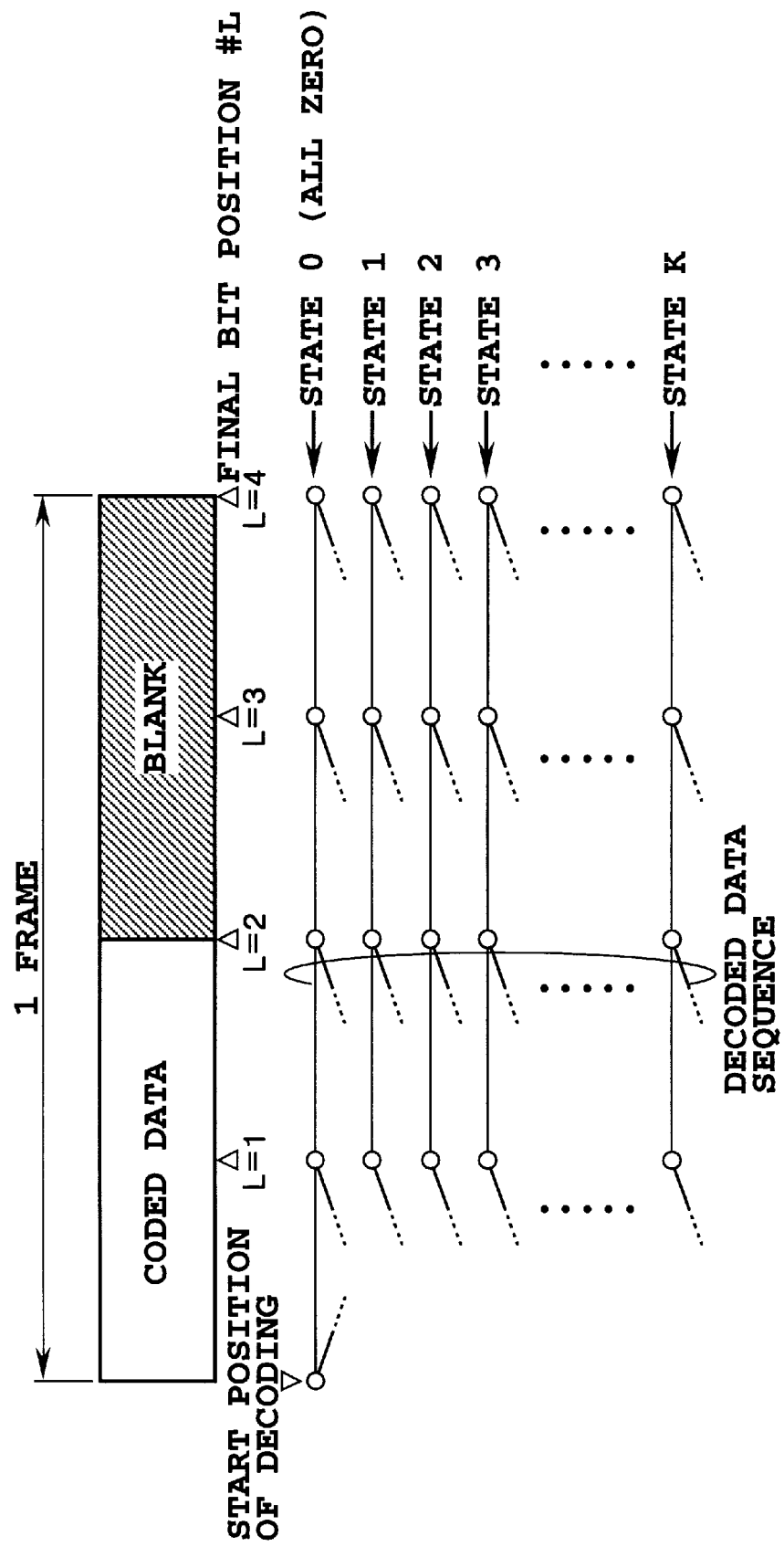
FIG. 5 is a diagram illustrating decoded data sequences in the maximum likelihood decoding in the embodiment 1 in accordance with the present invention.
Figure 6:
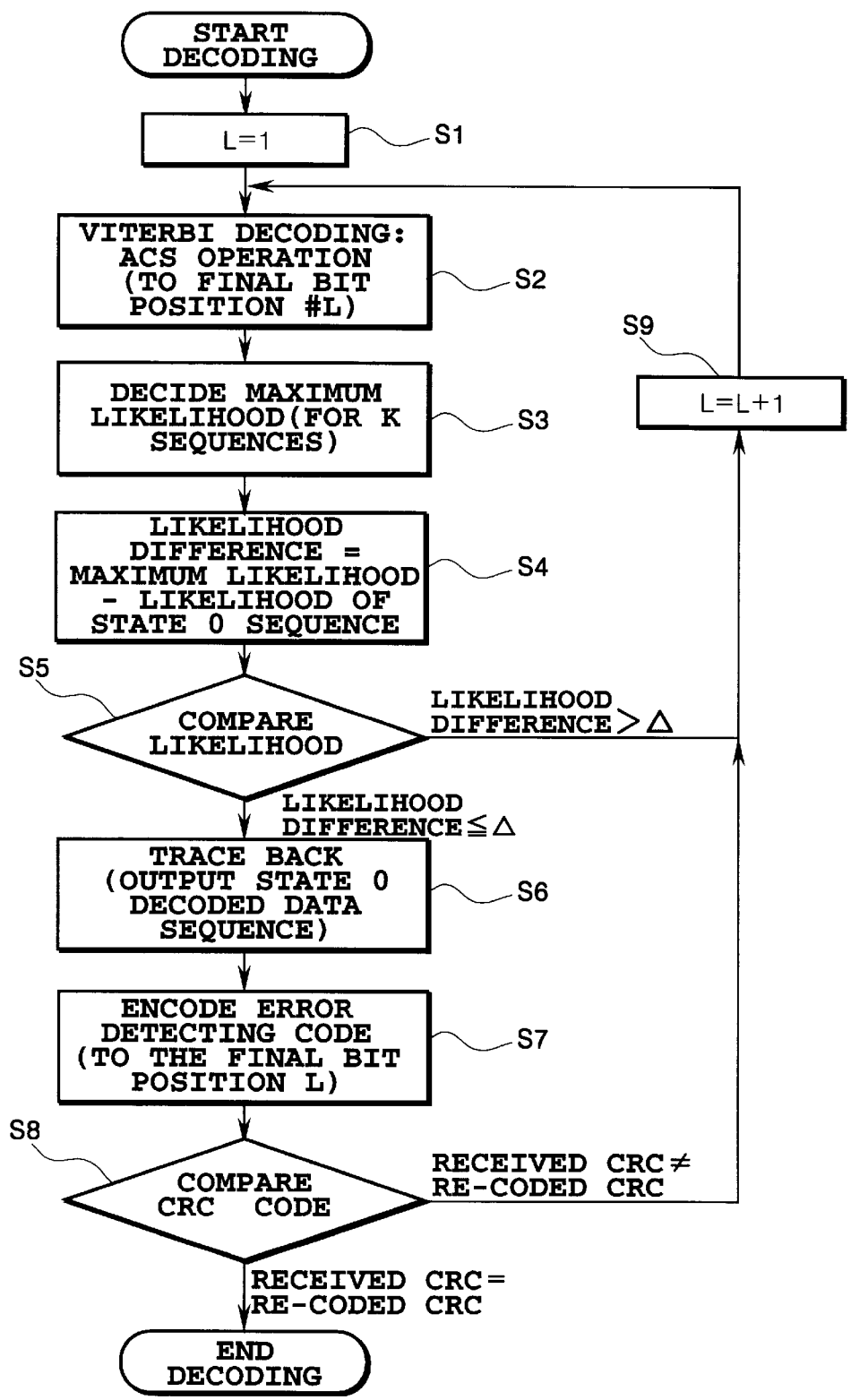
FIG. 6 is a flowchart illustrating rate decision algorithm in the embodiment 1 in accordance with the present invention.

FIG. 5 illustrates an example of the decoded data sequences in the maximum likelihood decoding, and FIG. 6 illustrates rate decision algorithm. Here, Viterbi decoding is assumed as the maximum likelihood decoding.

First, after starting the Viterbi decoding, the likelihoods of the survival decoded data sequences with respect to the transmitted data sequence are obtained at the assumed final bit positions (#L in FIGS. 5 and 6) at steps S1–S3, where the survival decoded data sequences are those that survive in respective states (that is, K decoded data sequences that reach the states 1–K in the example of FIG. 5). Subsequently, at step S4, the difference between the maximum value of the thus obtained likelihoods and the likelihood of a decoded data sequence with respect to the transmitted data sequence is obtained, which decoded data sequence has been obtained by terminating the decoding process (that is, the sequence reaching the state 0 in the example of FIG. 5).

Then, a decision is made whether the likelihood difference is within a predetermine range ($\Delta$ in FIG. 6) at step S5. If it is within the predetermined range, the selected decoded data sequence is output by trace back at step S6, and is subjected to the error detecting coding (CRC coding) at step S7.

The re-coded CRC is compared with the received CRC at step S8. If they agree with each other, the decoding is completed, and a decision is made that the assumed final bit position is the final bit position of the transmitted frame data. Then, the transmitted data is recovered.

If the likelihood difference exceeds $\Delta$, or the compared result of the CRCs does not match, the Viterbi decoding is continued with assuming the next final bit positions. If a plurality of final bit positions are detected, at which the likelihood difference is within $\Delta$, and the compared result of the error detecting codes indicates matching, the final bit position that gives the minimum likelihood difference can be decided at the final bit position of the transmitted frame data.

In the example of FIG. 5, if no error has occurred during the transmission, the sequence that reaches the state 0 at the second final bit position L=2 will give the maximum likelihood (likelihood difference=0), and the comparing result of the error detecting codes will match for that decoded sequence.

In this case, since the probability that the likelihood difference becomes zero is small at the other final bit positions, the present method can reduce the rate decision error rate to a much smaller value than the conventional method which carries out the rate decision based on only the comparing result of the error detecting codes.

On the other hand, if any error has occurred during the transmission, the sequence that reaches the state 0 is not necessarily the sequence that gives the maximum likelihood. In this case, setting $\Delta$ at an appropriate value makes it possible for the decoded sequences whose errors have been corrected to achieve the reduction effect of the error rate of the rate decision similar to the case in which no error has occurred during the transmission. By setting $\Delta$ at a smaller value in regions where $\Delta$ is below a particular value, the average rate decision error can be further reduced. This, however, will increase the average frame error rate, that is, the probability that the comparing result of the CRCs does not match+the rate decision error rate.

Accordingly, it is preferable that $\Delta$ be set at a small value in the data transmission which requires a very small rate decision error rate such as that of control data, at the expense of the frame error rate.

The value $\Delta$ can also be obtained by considering the tendency of errors that have occurred during the transmission such that $\Delta$ is set at a value obtained by multiplying a fixed value by the difference between the maximum and minimum values of the likelihoods obtained at the final bit positions.

The data transmission using the transmitter and receiver with the foregoing configuration enables the receiver to receive the seemingly variable rate transmitted data, in which the transmitter transmits each frame with varying the number of bits in each frame without transmitting to the receiver rate information representing the number of bits in each frame.

In addition, adopting the rate decision scheme utilizing the likelihood information obtained in the Viterbi decoding can greatly reduce the possibility of outputting the transmitted data with wrong length in the frame resulting from the rate decision error, thereby achieving highly reliable variable rate data transmission.

Embodiment 2

FIGS. 7A and 7B are block diagrams showing a transmitter and a receiver of an embodiment 2 in accordance with the present invention.

FIGS. 7A and 7B show configurations which add to those of FIGS. 1A and 1B the transmission of information representing the rate of transmitted data, and which makes a rate decision at the receiving side using that rate information. In FIGS. 7A and 7B, like portions to those of FIGS. 1A and 1B are designated by the same reference numerals. In the following description, the operations of portions different from those of FIGS. 1A and 1B are chiefly described.

First, the information representing the rate of the transmitted data is input to a terminal 5, and is supplied to a rate information memory 40. The contents of the rate information memory 40 is the rate information of the data held in the frame memory 1 (2), that is, information representing the number of the bit of the data. A multiplexer 6' sequentially outputs on a frame by frame basis the information representing the rate of the transmitted data, which is read from the rate information memory 40, the error detecting code calculated by the error detecting coder 4, and the transmitted data read from the frame memory 1 (2).

Figure 8A:
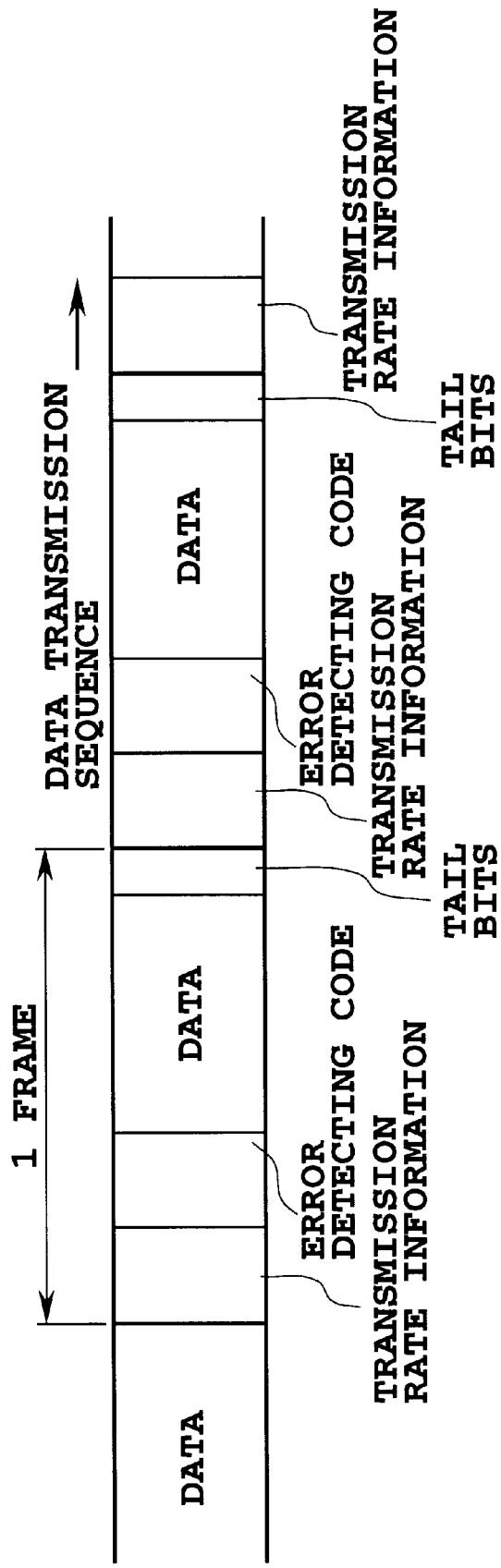
FIG. 8A is a diagram illustrating a frame structure of transmitted data in the embodiment 2 in accordance with the present invention.

FIGS. 8A and 8B illustrate the data sequences output from the multiplexer 6'.

On the other hand, an error correcting decoder 26' of the receiver as shown in FIG. 7B truncates the sequential Viterbi decoding which has been started from the initial position of each frame, and obtains the decoded result of the rate information bits placed at the initial position of the frame. The decoded result is held in a rate information memory 42.

Figure 9:
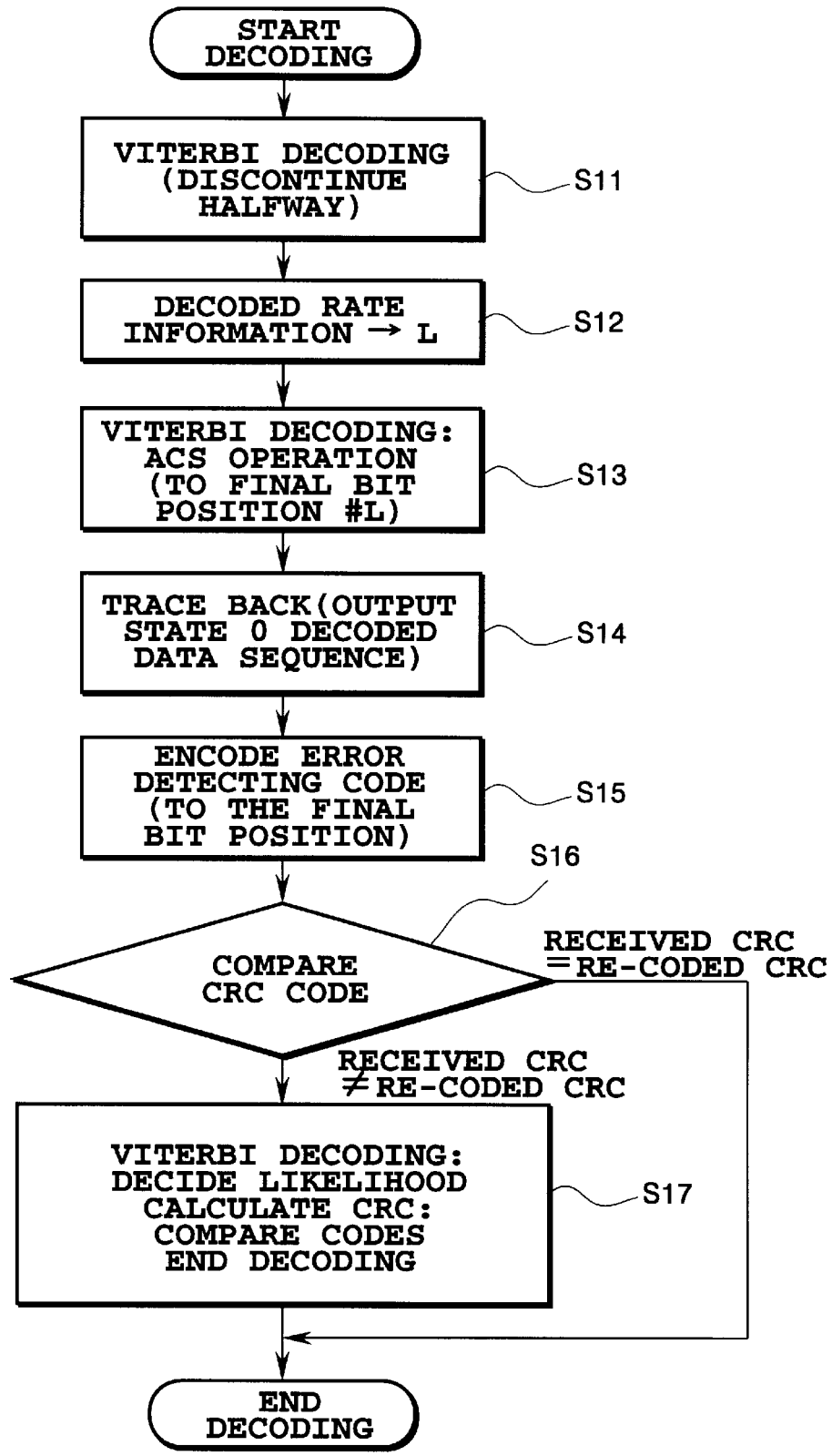
FIG. 9 is a flowchart illustrating rate decision algorithm in the embodiment 2 in accordance with the present invention.

FIG. 9 illustrates the rate decision algorithm in the receiver of the embodiment 2. The error correcting decoder 26, continues the Viterbi decoding of the frame data to the final bit indicated by the content of the rate information memory 42 at steps S11–S13. Then, it outputs by trace back a decoded data sequence obtained by terminating the decoding process at step S14, and carries out the error detecting coding (CRC coding) at step S15.

Then, the re-coded CRC is compared with the received CRC at step S16. If the compared result indicates matching of them, the decoding is completed, and the final bit position indicated by the content of the rate information memory 42 is decided as the final bit position of the transmitted frame data, and the transmitted data is restored.

If the comparing result of the CRCs indicates disagreement, with sequentially assuming the transmittable final bit positions of the frame data other than the final bit position indicated by the content of the rate information memory 42, the error correcting decoding and the calculation of the error detection code are carried out, and the rate decision is made using the likelihood information obtained in the Viterbi decoding and the comparing result of the error detecting codes at step S17 (which is the same as the processing of S1–S8 of FIG. 6).

The data transmission using the transmitter and receiver with the foregoing arrangement enables the receiver to positively detect the rate information when there is no transmission error. In addition, even if any error has occurred in the rate information during the transmission, the receiver can make the rate decision using the likelihood information obtained in the Viterbi decoding and the comparing result of the error detecting codes. Accordingly, the resultant frame error rate is improved, achieving a very small rate decision error rate. This enables a highly reliable, variable rate data transmission.

It is preferable to locate, immediately after the rate information bits, fixed length data sequences other than the transmitted data, such as the error detecting code, because the reliability of the rate information obtained by the Viterbi decoding increases with the length of the input signal stored in the decoder, that is, the length of the coded data sequence following the rate information.

In addition, it is possible for the transmitter to insert tail bits just after the rate information bits or the error detecting code, and for the receiver to decode down to the end bits once to obtain the received rate information or that information plus the received error detecting code, and then to restart decoding of the frame data to its final bit.

Embodiment 3

In this embodiment, coding to and decoding from the block code are carried out in the error correcting coder 8 and error correcting decoder 26 of FIGS. 1A and 1B, respectively.

In the coding, each frame data output from the multiplexer 6 is divided into blocks as illustrated in FIGS. 10A and 10B, and each block undergoes block coding (generation and addition of the parity bits) such as coding into the BCH code.

Figure 11:
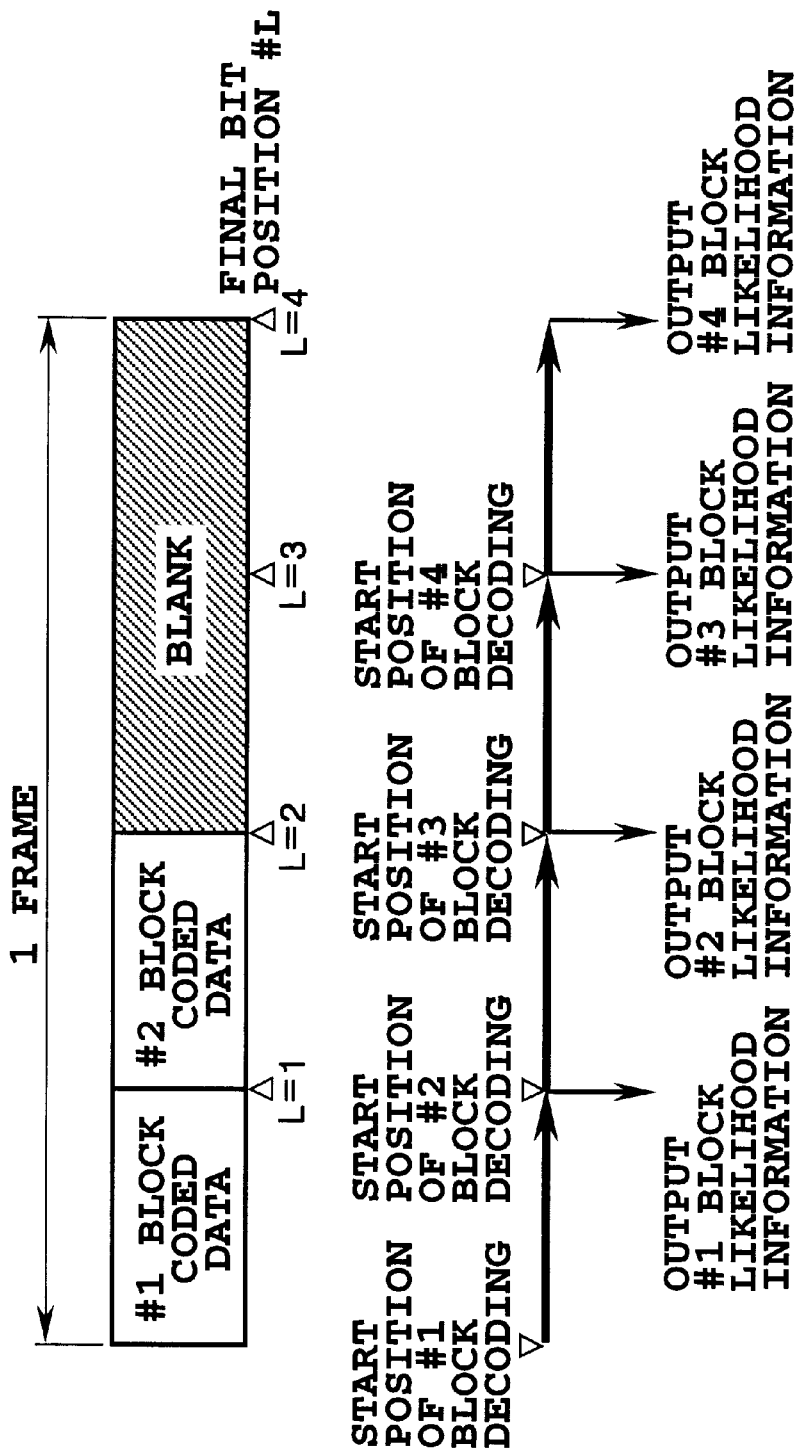
FIG. 11 is a diagram illustrating the sequence of the block decoding in the embodiment 3 in accordance with the present invention.

On the other hand, in the decoding, the individual blocks are decoded beginning from the first block as illustrated in FIG. 11, and the rate decision is made on the basis of the likelihood information, that is, the reliability information generated in the decoding process of the individual blocks.

Figure 12:
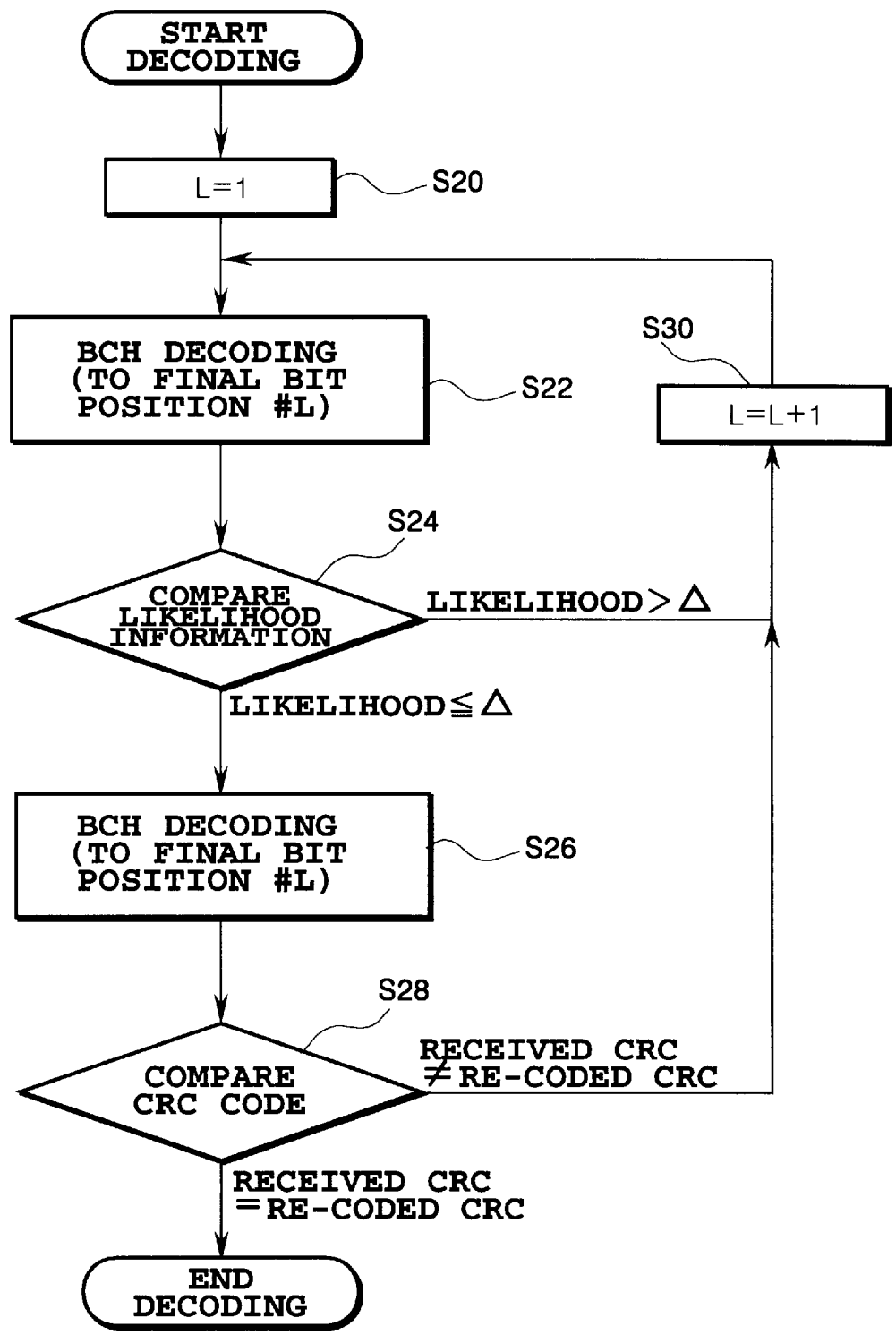
FIG. 12 is a flowchart illustrating rate decision algorithm in the embodiment 3 in accordance with the present invention.

FIG. 12 is a flowchart illustrating the decoding process. As long as the likelihood information obtained in the BCH decoding process is within a predetermined range (Δ in FIG. 12: it is assumed here that the likelihood information increases with the increase of the transmission errors occurred in block), the error detecting coding (CRC coding) is carried out to the final bit position #L at steps S20–S26. If a decision is made at step S28 that the re-coded CRC (check bits) agrees with the received CRC, the decoding is completed and the assumed final bit position is decided as the final bit position of the transmitted frame data, followed by the recovering of the transmitted data. If the likelihood information exceeds Δ, or the comparing result of the CRCs indicates disagreement, the decoding of the next block is continued through step S30. If multiple final bit positions are detected at which the likelihood information is within Δ and the comparing results of the error detecting codes indicate agreement after carrying out the decoding and calculating the error detecting codes at the entire final bit positions, the final bit position that gives the minimum likelihood information can be decided as the final bit position of the transmitted frame data.

As described above, according to the present invention, utilizing the likelihood information obtained in the maximum likelihood decoding process can greatly improve the rate decision error rate as compared with the conventional rate decision method using only the error detecting code. This makes it possible to provide more reliable variable rate data transmission that varies the transmission rate on a frame by frame basis during communication.

Furthermore, the variable rate data transmission of the rate information transmission type can implement higher quality variable data transmission that improves the frame error rate and rate decision error rate by applying, when any error has occurred during the transmission of the rate information, the rate decision method which utilizes the likelihood information and the error detecting code.

What is claimed is:

1. A data transmission method which varies an average transmission rate by transmitting frames, each of which has a fixed time length, and contains variable length transmitted data, said data transmission method comprising, at a transmitting side, the steps of:
  calculating an error detecting code of the transmitted data of each frame; and
  transmitting frame data at a constant transmission rate, said frame data including the error detecting code, transmitted data and tail bits, and having undergone error correcting coding using a convolutional code and interleaving common to respective frames, and at a receiving side, the steps of:
  successively assuming frame by frame entire transmittable final bit positions of the frame data after having performed, on received frame data, deinterleaving common to respective frames, and carrying out to the assumed final bit positions error correcting decoding based on maximum likelihood decoding and calculation of an error detecting code of a transmitted data portion;
  deciding, at each final bit position during error correcting decoding, that the final bit position is the final bit position of the transmitted frame data if a difference between a maximum value of likelihoods of a plurality of decoded data sequence candidates with respect to the transmitted data sequence and a likelihood of a decoded data sequence obtained by terminating decoding with respect to the transmitted data sequence is in a predetermined range, and the calculated error detecting code agrees with a received error detecting code; and recovering the variable length transmitted data based on a result obtained by the step of deciding.

2. A data transmission method which varies an average transmission rate by transmitting frames, each of which has a fixed time length, and contains variable length transmitted data, said data transmission method comprising, at a transmitting side, the steps of:

calculating, frame by frame, transmission rate information representing a transmission rate of the transmitted data, and an error detecting code of the transmitted data; and transmitting frame data at a constant transmission rate, said frame data including the transmission rate information, the error detecting code, transmitted data and tail bits, and having undergone error correcting coding using a convolutional code and interleaving common to respective frames, and at a receiving side, the step of:

assuming frame by frame a final bit position based on received transmission rate information after having performed, on received frame data, deinterleaving common to respective frames, and carrying out to the assumed final bit position error correcting decoding based on maximum likelihood decoding and calculation of an error detecting code of a transmitted data portion, deciding that the assumed final bit position is a final bit position of the transmitted frame data if the calculated error detecting code agrees with a received error detecting code bit by bit;

successively assuming with respect to the received frame data after the deinterleaving, if the error detecting codes disagree at the step of deciding, entire transmittable final bit positions of the frame data other than the final bit position assumed based on the received transmission rate information, and carrying out to the assumed final bit positions error correcting decoding based on maximum likelihood decoding and calculation of an error detecting code of a transmitted data portion;

deciding at each final bit position during error correcting decoding, that the final bit position is the final bit position of the transmitted frame data if a difference between a maximum value of likelihoods of decoded data sequence candidates with respect to the transmitted data sequence and a likelihood of a decoded data sequence obtained by terminating decoding with respect to the transmitted data sequence is in a predetermined range, and the calculated error detecting code agrees with a received error detecting code; and recovering variable length transmitted data based on a result obtained by the step of deciding.

3. The data transmission method as claimed in claim 1 or 2, further comprising the step of deciding that a final bit position that makes the difference of the likelihoods minimum is the final bit position of the transmitted frame data, in the case where a plurality of final bit positions are detected which satisfy, at each final bit position during error correcting decoding, conditions that the difference between the maximum value of the likelihoods of the decoded data sequence candidates with respect to the transmitted data sequence and the likelihood of the decoded data sequence obtained by terminating decoding with respect to the transmitted data sequence is in the predetermined range, and the calculated error detecting code agrees with the received error detecting code.

4. A data transmission system which varies an average transmission rate by transmitting frames, each of which has a fixed time length, and contains variable length transmitted data, said data transmission system comprising:

in a transmitter, means for calculating an error detecting code of the transmitted data of each frame; and means for transmitting frame data at a constant transmission rate, said frame data including the error detecting code, transmitted data and tail bits, and having undergone error correcting coding using a convolutional code and interleaving common to respective frames, and in a receiver, means for successively assuming frame by frame entire transmittable final bit positions of the frame data after having performed, on received frame data, deinterleaving common to respective frames, and carrying out to the assumed final bit positions error correcting decoding based on maximum likelihood decoding and calculation of an error detecting code of a transmitted data portion;

means for deciding, at each final bit position during error correcting decoding, that the final bit position is the final bit position of the transmitted frame data if a difference between a maximum value of likelihoods of a plurality of decoded data sequence candidates with respect to the transmitted data sequence and a likelihood of a decoded data sequence obtained by terminating decoding with respect to the transmitted data sequence is in a predetermined range, and the calculated error detecting code agrees with a received error detecting code; and means for recovering the variable length transmitted data based on a result obtained by the step of deciding.

5. A data transmission system which varies an average transmission rate by transmitting frames, each of which has a fixed time length, and contains variable length transmitted data, said data transmission system comprising:

in a transmitter, means for calculating, frame by frame, transmission rate information representing a transmission rate of the transmitted data, and an error detecting code of the transmitted data; and means for transmitting frame data at a constant transmission rate, said frame data including the transmission rate information, the error detecting code, transmitted data and tail bits, and having undergone error correcting coding using a convolutional code and interleaving common to respective frames, and in a receiver, means for assuming frame by frame a final bit position based on received transmission rate information after having performed, on received frame data, deinterleaving common to respective frames, and carrying out to the assumed final bit position error correcting decoding based on maximum likelihood decoding and calculation of an error detecting code of a transmitted data portion;

means for deciding that the assumed final bit position is a final bit position of the transmitted frame data if the calculated error detecting code agrees with a received error detecting code bit by bit;

means for successively assuming with respect to the received frame data after the deinterleaving, if the error detecting codes disagree at the step of deciding, entire transmittable final bit positions of the frame data other than the final bit position assumed based on the received transmission rate information, and carrying out to the assumed final bit positions error correcting decoding based on maximum likelihood decoding and calculation of an error detecting code of a transmitted data portion;

means for deciding, at each final bit position during error correcting decoding, that the final bit position is the final bit position of the transmitted frame data if a difference between a maximum value of likelihoods of decoded data sequence candidates with respect to the transmitted data sequence and a likelihood of a decoded data sequence obtained by terminating decoding with respect to the transmitted data sequence is in a predetermined range, and the calculated error detecting code agrees with a received error detecting code; and recovering variable length transmitted data based on a result obtained by the step of deciding.

6. The data transmission system as claimed in claim 4 or 5, further comprising means for deciding that a final bit position that makes the difference of the likelihoods minimum is the final bit position of the transmitted frame data, in the case where a plurality of final bit positions are detected which satisfy, at each final bit position during error correcting decoding, conditions that the difference between the maximum value of the likelihoods of the decoded data sequence candidates with respect to the transmitted data sequence and the likelihood of the decoded data sequence obtained by terminating decoding with respect to the transmitted data sequence is in the predetermined range, and the calculated error detecting code agrees with the received error detecting code.

7. A data transmission method which varies an average transmission rate by transmitting frames, each of which has a fixed time length, and contains variable length transmitted data, said data transmission method comprising, at a transmitting side, the steps of;
calculating an error detecting code of the transmitted data of each frame; and
transmitting frame data at a constant transmission rate, said frame data, which includes the error detecting code and transmitted data, having been divided into blocks, each of which has undergone error correcting coding using a block code, and said frame data having undergone interleaving common to respective frames, and at a receiving side, the steps of:
successively assuming frame by frame entire transmittable final bit positions of the frame data after having performed, on received frame data, deinterleaving common to respective frames, and carrying out to the assumed final bit positions error correcting decoding based on block decoding of respective blocks beginning from a first block, and calculation of an error detecting code of a transmitted data portion;
deciding that the final bit position is the final bit position of the transmitted frame data if likelihoods obtained during error correcting decoding of individual blocks are in a predetermined range, and the calculated error detecting code agrees with a received error detecting code; and
recovering the variable length transmitted data based on a result obtained by the step of deciding.

8. A data transmission method which varies and average transmission rate by transmitting frames, each of which has a fixed time length, and contains variable length transmitted data, said data transmission method comprising, at a transmitting side, the steps of:
calculating, frame by frame, transmission rate information representing a transmission rate of the transmitted data, and an error detecting code of the transmitted data; and
transmitting frame data at a constant transmission rate, said frame data including the transmission rate information, the error detecting code, and transmitted data, and having undergone error correcting coding using a block code and interleaving common to respective frames, and at a receiving side, the steps of:
assuming frame by frame a final bit position based on received transmission rate information after having performed, on received frame data, deinterleaving common to respective frames, and carrying out to the assumed final bit position error correcting decoding base on block decoding on a block by block basis beginning from a first block of the frame data, and calculation of an error detecting code of a transmitted data portion;
deciding that the assumed final bit position is a final bit position of the transmitted frame data if the calculated error detecting code agrees with a received error detecting code bit by bit;
successively assuming with respect to the received frame data after the deinterleaving, if the error detecting code disagree at the step of deciding, entire transmittable final bit positions of the frame data other than the final bit positions of the frame data other than the final bit position assumed based on the received transmission rate information, and carrying out to the assumed final bit positions error correcting decoding based on block decoding and calculation of an error detecting code of a transmitted data portion;
deciding, at each final bit position during error collecting decoding, that the final bit position is the final bit position of the transmitted frame data if likelihoods obtained in error correcting decoding of respective blocks are in a predetermined range, and the calculated error detecting code agrees with a received error detecting code; and
recovering variable length transmitted data base on a result obtained by the step of deciding.

9. The data transmission method as claimed in claim 7 or 8, further comprising the step of deciding that a final bit position that makes the difference of the likelihoods minimum is the final bit position of the transmitted frame data, in the case where a plurality of final bit positions are detected which satisfy, at each final bit position during error correcting decoding, conditions that the likelihoods obtained during the error correcting decoding of the respective blocks are in the predetermined range, and the calculated error detecting code agrees with the received error detecting code.

10. A data transmission system which varies and average transmission rate by transmitting frames, each of which has a fixed time length, and contains variable length transmitted data, said data transmission system comprising;

in a transmitter,
means for calculating an error detecting code of the transmitted data of each frame; and
means for transmitting frame data at a constant transmission rate, said frame data, which includes the error detecting code and transmitted data, having been divided into blocks each of which has undergone error correcting coding using a block code, and said frame data having undergone interleaving common to respective frames, and in a receiver, means for successively assuming frame by frame entire transmittable final bit positions of the frame data after having performed, on received frame data, deinterleaving common to respective frames, and for carrying out to the assumed final bit positions error correcting decoding based on block decoding of respective blocks beginning from a first block, and calculation of an error detecting code of a transmitted data portion;

means for deciding that the final bit position is the final bit position of the transmitted frame data if likelihoods obtained during error correcting decoding of individual blocks are in a predetermined range, and the calculated error detecting code agrees with a received error detecting code; and means for recovering the variable length transmitted data based on a result obtained by the means for deciding.

11. A data transmission system which varies an average transmission rate by transmitting frames, each of which has a fixed time length, and contains variable length transmitted data, said data transmission system comprising:

in a transmitted, means for calculating, frame by frame, transmission rate information representing a transmission rate of the transmitted date, and an error detecting code of the transmitted data; and means for transmitting frame data at a constant transmission rate, said frame data including the transmission rate information, the error detecting code, and transmitted data, and having undergone error correcting coding using a block code and interleaving common to respective frames, and in a receiver, means for assuming frame by frame a final bit position based on received transmission rate information after having performed, on received frame data, deinterleaving common to respective frames, and carrying out to the assumed final bit position error correcting decoding based on block decoding on a block by block basis beginning from a first block of the frame data, and calculation of an error detecting code of a transmitted data portion;

means for deciding that the assumed final bit position is a final bit position of the transmitted frame data if the calculated error detecting code agrees with a received error detecting code bit by bit;

means for successively assuming with respect to the received frame data after the deinterleaving, if the error detecting codes disagree in the means for deciding, entire transmittable final bit positions of the frame data other than the final bit position assumed base on the received transmission rate information, and carrying out to the assumed final bit positions error correcting decoding based on block decoding and calculation of an error detecting code of a transmitted data portion;

means for deciding, at each final bit position during error correcting decoding, that the final bit position is the final bit position of the transmitted frame data if likelihoods obtained in error correcting decoding of respective blocks are in a predetermine range, and the calculated error detecting code agrees with a received error detecting code; and means for recovering variable length transmitted data base on a result obtained by the means for deciding.

12. The data transmission system as claimed in claim 10 or 11, further comprising means for deciding that final bit position that makes the difference of the likelihoods minimum is the final bit position of the transmitted frame data, in the case where a plurality of final bit positions are detected which satisfy, at each final bit position during error correcting decoding, conditions that the likelihoods obtained during the error correcting decoding of the respective blocks are in the predetermined range, and the calculated error detecting code agrees with the received error detecting code.

13. A transmitter for implementing the data transmission method as claimed in any one of claims 1–2, or 7–8.

14. A receiver for implementing the data transmission method as claimed in any one of claims 1–2, or 7–8.

* * * * *

UNITED STATES PATENT AND TRADEMARK OFFICE
CERTIFICATE OF CORRECTION

PATENT NO : 6,108,384
DATED : August 22, 2000
INVENTOR(S) : Yukihiko Okumura et al.

It is certified that error appears in the above-identified patent and that said Letters Patent are hereby corrected as shown below:

In page 1, Title, delete "DATA TRANSMITTION METHOD, DATA TRANSMITTING SYSTEM AND TRANSMITTER AND RECEIVER" and insert in its place --DATA TRANSMISSION METHOD, DATA TRANSMISSION SYSTEM AND TRANSMITTER AND RECEIVER--.

Column 1, lines 1-3, delete "DATA TRANSMITTION METHOD, DATA TRANSMITTING SYSTEM AND TRANSMITTER AND RECEIVER" and insert in its place --DATA TRANSMISSION METHOD, DATA TRANSMISSION SYSTEM AND TRANSMITTER AND RECEIVER--.

Column 20, Claim 12, line 2, insert --a-- between "that" and "final".

Signed and Sealed this

Twenty-ninth Day of May, 2001

*Attest:*

NICHOLAS P. GODICI

*Attesting Officer*   *Acting Director of the United States Patent and Trademark Office*